(12) United States Patent
Yilmaz

(10) Patent No.: US 6,496,133 B1
(45) Date of Patent: Dec. 17, 2002

(54) RESISTOR STRING INTEGRATED CIRCUIT AND METHOD FOR REDUCED LINEARITY ERROR

(75) Inventor: Abdullah Yilmaz, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/903,106

(22) Filed: Jul. 11, 2001

(51) Int. Cl.[7] .............................................. H03M 1/78
(52) U.S. Cl. ...................................... 341/154; 341/144
(58) Field of Search ................................. 341/154, 144, 341/155, 156, 159, 145, 118

(56) References Cited

U.S. PATENT DOCUMENTS

| | | | |
|---|---|---|---|
| 4,612,531 A | 9/1986 | Dingwall et al. ............ 341/156 |
| 4,942,397 A | * 7/1990 | Real ............................ 341/118 |
| 5,059,978 A | 10/1991 | Valdenaire ................... 341/145 |
| 5,093,661 A | 3/1992 | Tanimoto ..................... 341/144 |
| 5,099,240 A | * 3/1992 | Nakatani et al. ............. 341/154 |
| 5,194,867 A | * 3/1993 | Fisher ......................... 341/159 |
| 5,627,537 A | 5/1997 | Quinlan et al. .............. 341/144 |
| 5,703,588 A | * 12/1997 | Rivoir et al. ................ 341/159 |
| 5,969,657 A | * 10/1999 | Dempsey et al. ............ 341/145 |
| 5,999,115 A | * 12/1999 | Connell et al. .............. 341/145 |
| 6,163,288 A | * 12/2000 | Yoshizawa ................... 341/144 |

* cited by examiner

Primary Examiner—Michael Tokar
Assistant Examiner—Jean Bruner Jeanglaude
(74) Attorney, Agent, or Firm—W. Daniel Swayze, Jr.; W. James Brady; Frederick J. Telecky, Jr.

(57) ABSTRACT

Linearity of an n-bit integrated resistor string is improved by arraying the $2^n$ resistors in $2^k$ columns of $2^m$ series coupled resistors each. The $2^k$ columns of resistors are grouped in $2^g$ groups of serially coupled columns of resistors with the total resistance of each group of columns of resistors substantially the same as the total resistance of each of the other groups of columns of resistors.

10 Claims, 4 Drawing Sheets

RESISTOR STRING INTEGRATED CIRCUIT AND METHOD FOR REDUCED LINEARITY ERROR

FIELD OF INVENTION

This invention relates generally to an integrated circuit including a resistor string and to a method for its manufacture, and more specifically to a resistor string integrated circuit having reduced linearity error and to a method for reducing the linearity error of a resistor string integrated circuit.

BACKGROUND OF THE INVENTION

Some integrated circuits (ICs) such as digital to analog converters (DACs) and analog to digital (ADCs) converters use a resistor string to provide a plurality of comparator reference voltages. The resistor string includes a plurality of resistors, ideally identical unit resistors, coupled in series between two external reference voltages, a high reference voltage ($V_{rH}$) and a low reference voltage ($V_{rL}$). To implement an n-bit DAC, a string of $2^n$ resistors is required. If the resistors are identical, by contacting the nodes between the $2^n$ resistors, $2^n+1$ precisely known reference tap voltages (including the two external reference voltages) can be realized. In an 8-bit DAC, for example, $2^8$ or 256 resistors are coupled in series to provide the DAC output voltages. Depending on the DAC input code, one of these tap voltages is directed to the output of the resistor string.

Unfortunately, it is not possible to produce a large number of identical resistors on an integrated circuit chip. Because of this, the $2^n-1$ internal tap voltages cannot be precisely known. Errors in resistor values, such as random and gradient errors, can accumulate as one moves from resistor to resistor along the resistor string between the two external reference voltages. This cumulative error results in an integral non-linearity (INL) error that, in turn, causes error in the output of the DAC.

Random errors in resistor values are caused, for example, by variations in the physical size of the resistors or by variations in the conductivity of the material from which the resistors are fabricated. These variations may be random or may be caused by gradients in processing variables. Gradient errors (which can be either linear or non-linear) are often addressed in IC layout and manufacture by interdigitating the affected components. With the large number of resistors commonly used in a resistor string, however, it is not practical to interdigitate all of the resistors. For practical layout reasons and to achieve some degree of interdigitation, resistor strings are often laid out in a plurality of columns of series connected resistors and the columns, in turn, are series connected.

For example, FIG. 1 illustrates a prior art implementation of an 8-bit (256 resistor) resistor string 99. Resistor string 99 includes 16 columns 101–116 of series coupled unit resistors. Each column includes 16 resistors such as resistors 121–136 in column 101. Similar resistors are included in each of the other columns although the other resistors are not labeled with reference numbers. The illustrated placement of the columns matches the relative physical layout location of the columns as implemented in an integrated circuit embodiment. For example, column 102 is physically located between columns 101 and 103. Although it is impractical to interdigitize all of the unit resistors to reduce gradient errors that may occur due to gradients in processing the resistors, it is possible to interdigitate the columns.

In accordance with this embodiment, the columns are connected in series by interconnecting column 101 to column 104 by a conductive interconnect 140, column 104 to column 105 by a conductive interconnect 141, column 105 to column 108 by a conductive interconnect 142, column 108 to column 109 by a conductive interconnect 143, column 109 to column 112 by a conductive interconnect 144, column 112 to column 113 by a conductive interconnect 145, column 113 to column 116 by a conductive interconnect 146, column 116 to column 115 by a conductive interconnect 147, column 115 to column 114 by a conductive interconnect 148, column 114 to column 111 by a conductive interconnect 149, column 111 to column 110 by a conductive interconnect 150, column 110 to column 107 by a conductive interconnect 151, column 107 to column 106 by a conductive interconnect 152, column 106 to column 103 by a conductive interconnect 153, and column 103 to column 102 by a conductive interconnect 154. The end of column 101 is also coupled to a voltage reference terminal 156 that can be coupled to an external voltage reference supply (not illustrated) and the end of column 102 can be coupled to a second voltage reference terminal 158 that can be coupled to an external voltage reference supply (not illustrated).

A voltage reference tap point is provided at the node at each end of each of the unit resistors. For example, in column 101 voltage reference tap points 161–177 are provided at the ends of resistors 121–136, respectively. Similar voltage reference tap points are provided (although not labeled with reference numbers) in each of the other columns. Switches 181–197 are coupled to voltage reference tap points 161–177, respectively to selectively couple a voltage reference tap point to the output (not illustrated) of the resistor string circuit. Again, only the switches coupled to the voltage reference tap points in column 101 have been labeled with reference numbers.

Although this resistor string layout may address some of the gradient errors, it does not address the occurrence and effect of random errors. Further, a gradient from one end of the string to the other will create linearity errors. If the layout of the resistor string is one column of unit resistors or a string of sequentially connected columns of resistors, the linear gradient of the unit resistor values will produce a bow shaped linearity error, e.g., with the correct value at the ends coupled to the external reference voltages and maximum error in the center of the string, at the output of the string.

Moreover, it is not practical to trim the resistance of each of the $2^n$ resistors in an integrated resistor string to a precise value. Because of the large number of components already required for the n-bit string, it is also not practical to add additional components (and hence increase the size of the IC) that might otherwise aid in reducing the linearity error. Accordingly, an integrated circuit and method are needed that can reduce linearity errors in an integrated resistor string but will not increase the complexity of processing the IC and will not increase the device count of the IC.

SUMMARY OF THE INVENTION

A resistor string integrated circuit and method according to the present invention addresses many of the problems of the prior art. In accordance with various aspects of the present invention, an improved resistor string integrated circuit having reduced linearity error and to a method for reducing the linearity error of a resistor string integrated circuit are provided.

In accordance with an exemplary embodiment of the invention, to reduce the linearity error that results from the processing of an integrated resistor string, the resistor string is implemented by forming a plurality of unit resistors coupled in series between two voltage reference terminals. The series coupled unit resistors are laid out in a plurality of columns, and the columns are intercoupled in groups of columns. The columns included in each of the groups of columns are suitably selected such that the total resistance of each group of columns is substantially the same. By grouping the columns so that each group of columns has substantially the same resistance, the linearity error is substantially zero at the ends of each of the groups and the linearity error of the entire string is reduced.

In addition, the resistor string integrated circuit and method can be configured with any number of resistors, columns and groups of columns. For example, the linearity of an n-bit integrated resistor string can be improved by arraying the $2^n$ resistors in $2^k$ columns of $2^m$ series coupled resistors each. The $2^k$ columns of resistors are grouped in $2^g$ groups of serially coupled columns of resistors with the total resistance of each group of columns of resistors substantially the same as the total resistance of each of the other groups of columns of resistors.

DETAILED DESCRIPTION OF EXEMPLARY EMBODIMENT

Figure 1:
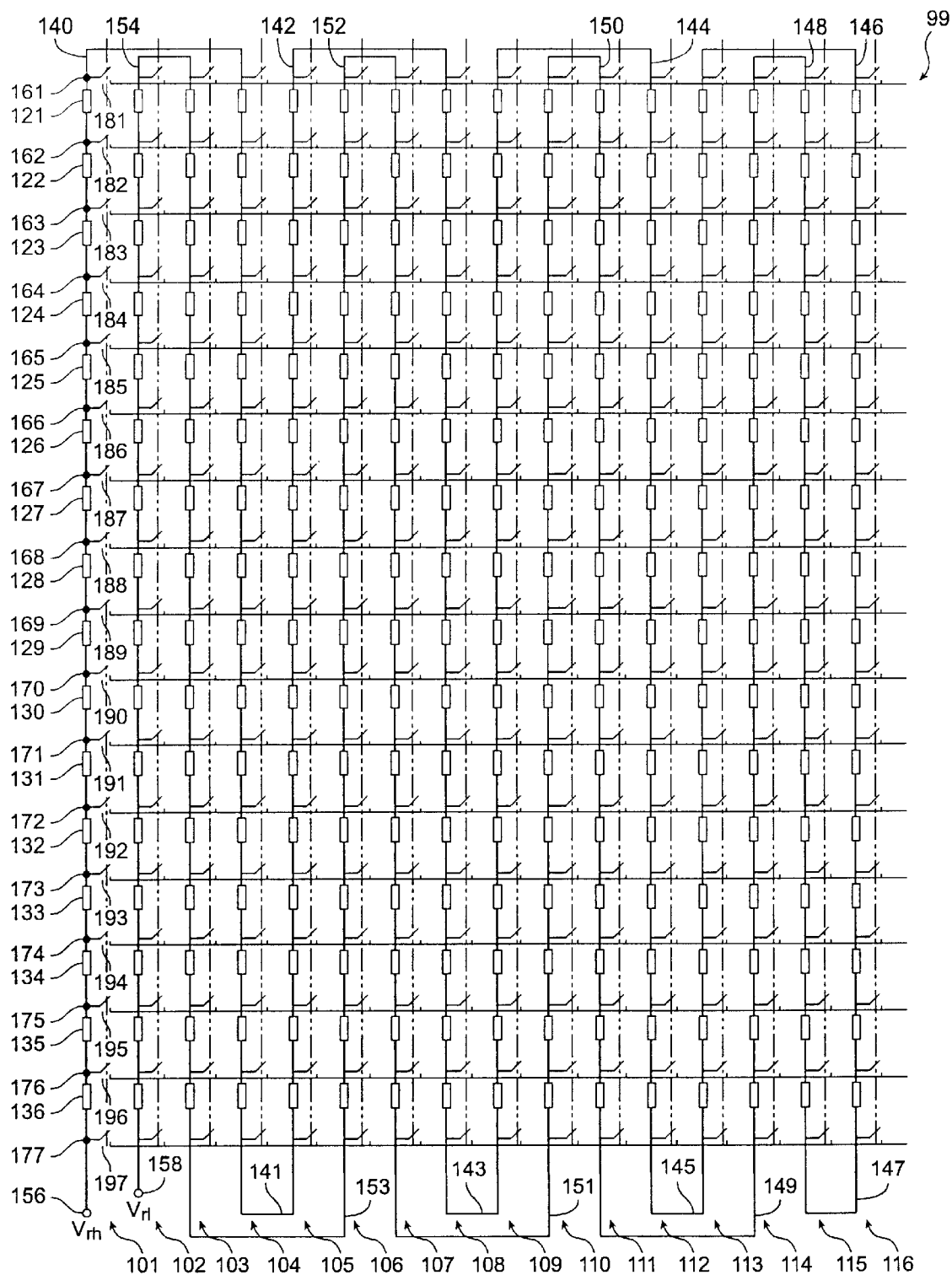
FIG. 1 illustrates schematically a prior art integrated resistor string.

The present invention may be described herein in terms of various functional components and various processing steps. It should be appreciated that such functional components may be realized by any number of hardware or structural components configured to perform the specified functions. For example, the present invention may employ various integrated components, e.g., buffers, supply rail references, current mirrors, logic devices and the like, which are comprised of various electrical devices, e.g., resistors, transistors, capacitors, diodes and the like whose values may be suitably configured for various intended purposes. In addition, the present invention may be practiced in any integrated circuit application. Such general applications that may be appreciated by those skilled in the art in light of the present disclosure are not described in detail herein. However for purposes of illustration only, exemplary embodiments of the present invention will be described herein in connection with a ADCs and DACs. Further, it should be noted that while various components may be suitably coupled or connected to other components within exemplary circuits, such connections and couplings can be realized either by direct connection between components, or by connection through other components and devices located therebetween.

As discussed above, previous approaches for solving the problems of resistor string layouts have difficulty in reducing the linearity error, and are often not practical. However, in accordance with various aspects of the present invention, an improved resistor string integrated circuit having reduced linearity error and to a method for reducing the linearity error of a resistor string integrated circuit are provided.

In accordance with an exemplary embodiment of the invention, to reduce the linearity error that results from the processing of an integrated resistor string, the resistor string is implemented by forming a plurality of unit resistors coupled in series between two voltage reference terminals. The series coupled unit resistors are laid out in a plurality of columns, and the columns are intercoupled in groups of columns. The columns included in each of the groups of columns are suitably selected such that the total resistance of each group of columns is substantially the same. By grouping the columns so that each group of columns has substantially the same resistance, the linearity error is substantially zero at the ends of each of the groups and the linearity error of the entire string is reduced.

Various embodiments of the invention will be explained and illustrated with reference to an 8-bit resistor string ($2^8$ or 256 series coupled unit resistors) laid out in 16 columns with 16 resistors in each column. Such a resistor string is referred to for illustrative purposes only and not by way of limitation. As will be apparent to those of skill in the art of designing linear circuits, the invention is applicable to resistor strings having more or less than 8 bits and to layouts having more or less than 16 columns and more or less than 16 resistors in each column. Accordingly, the resistor string integrated circuit and method can be configured with any number of resistors, columns and groups of columns. For example, the linearity of an n-bit integrated resistor string can be improved by arraying the $2^n$ resistors in $2^k$ columns of $2^m$ series coupled resistors each. The $2^k$ columns of resistors are grouped in $2^g$ groups of serially coupled columns of resistors with the total resistance of each group of columns of resistors substantially the same as the total resistance of each of the other groups of columns of resistors.

Figure 2:
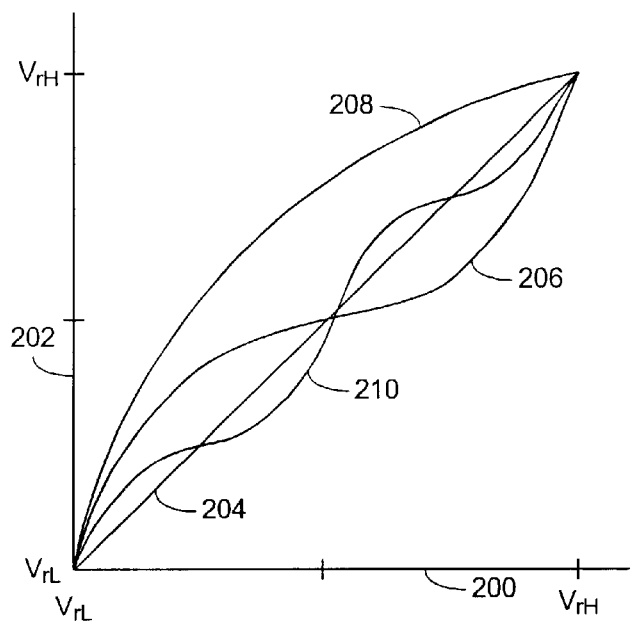
FIG. 2 graphically illustrates and compares achieved results.

FIG. 2 illustrates graphically a comparison between the desired output voltage reference 200 recorded along the horizontal axis and the actual output voltage reference 202 recorded along the vertical axis. Curve 204 indicates the ideal resistor string reference voltage output, a substantially straight line between the low external reference voltage $V_{rL}$ and the high external reference voltage $V_{rH}$. Actually the ideal reference voltage output 204 would exhibit $2^n$ steps as the voltage difference $V_{rH}-V_{rL}$ is divided into $2^n$ discrete voltage drops by the $2^n$ unit resistors. Assuming a linearly increasing resistor gradient error from column 101 to column 116 of resistor string 99 illustrated in FIG. 1, a generally S-shaped linearity error at the output of the resistor string will result as illustrated by curve 206. Curve 206 crosses curve 204 (zero linearity error) at the midpoint between the two external reference voltages because of the manner in which the columns of resistors are serially coupled. If the columns of the resistor string are interconnected to average out deviations in the values of the unit resistors so that the total series resistance of the first 8 columns of the resistor string is substantially the same as the total series resistance of the last 8 columns of the resistor string, the linearity error at the midpoint will be zero because the current through the resistor string is the same. In comparison. a resistor string (not illustrated) in which each column in the layout is coupled to the adjacent column (essentially one long string of serially coupled resistors) would exhibit the generally bow shaped linearity error at the output of the resistor string as illustrated by curve 208.

However, in accordance with an exemplary embodiment of the invention the linearity error of a resistor string can be reduced below that for a resistor string such as resistor string 99 by interconnecting the columns of resistors in the following manner. This embodiment of the invention can be applied to any n-bit resistor string having $2^m$ serially coupled unit resistors. The $2^n$ resistors are arranged in $2^k$ columns, each having $2^m$ series coupled unit resistors. Here n, k, and m are integers and n=k+m. The $2^k$ columns are grouped into $2^g$ groups of columns where g is an integer having a value greater than 1. Conductive connectors serially couple the columns within each group of columns. The groups of columns can be selected such that the total series resistance of each group of columns is substantially the same as the total series resistance of each other group of columns.

Conductive connectors can be configured to serially couple the groups of columns. The extremities of the resistor string can then be coupled between first and second external voltage reference terminals. In addition, the grouping of the columns of resistors into groups having substantially equal resistance can be provided in various manners. For example, in accordance with an exemplary embodiment, the $2^k$ columns can be arrayed in parallel, with the columns suitably numbered sequentially from 1 to $2^k$ in accordance with the physical location of the columns. The columns can be divided into groups of columns with each group having the same number of columns and with the sum of the column numbers being the same for each group. As a result of grouping the columns in this manner, the random differences and the gradient caused differences in resistance values for the $2^n$ unit resistors can be averaged out to reduce the linearity error.

Figure 3:
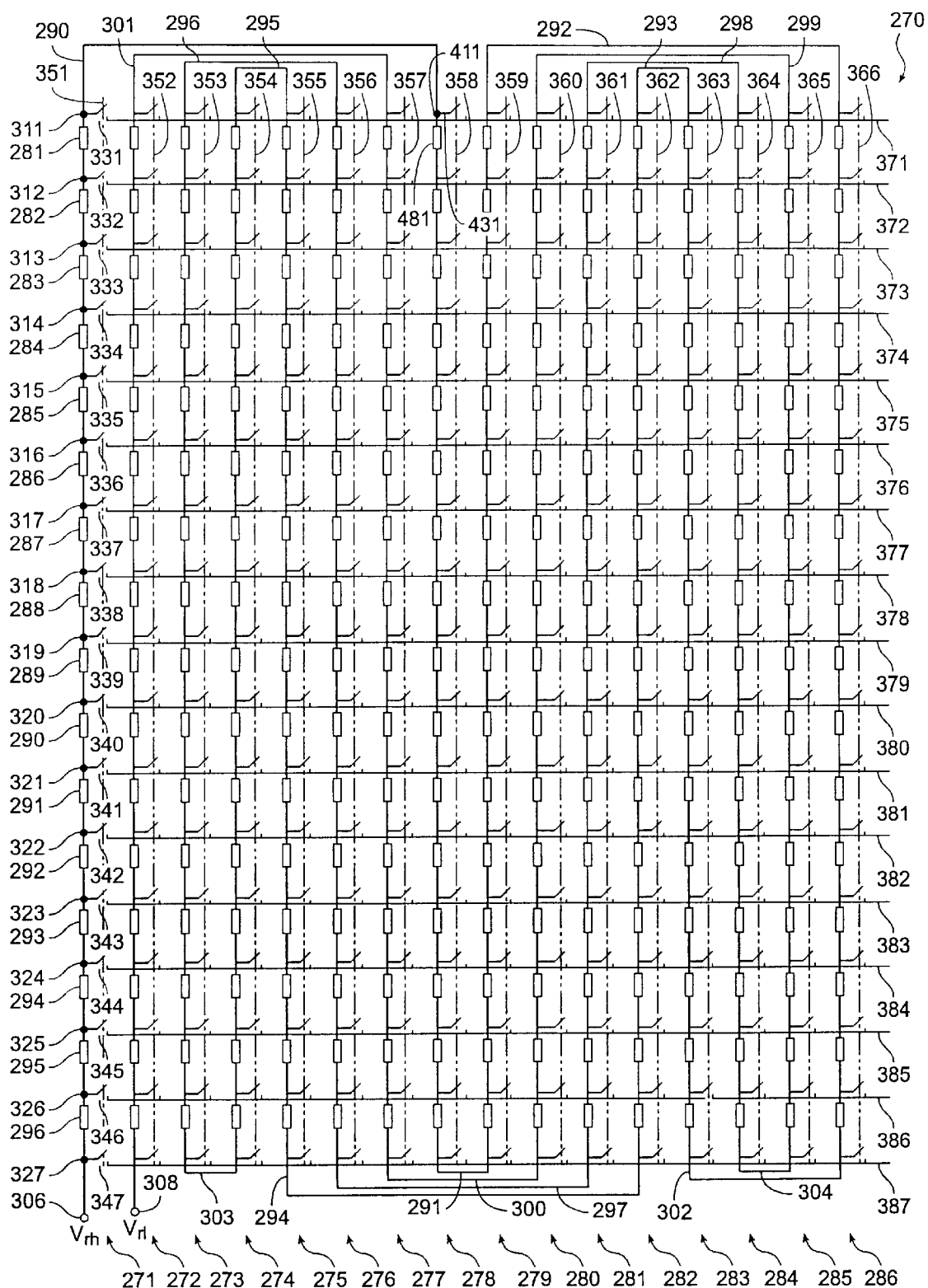
FIG. 3 illustrates schematically a resistor string in accordance with an exemplary embodiment of the present invention.

For purposes of illustration only, but without limitation, an exemplary embodiment of the invention is illustrated in FIG. 3 as an 8-bit resistor string 270 having 256 (that is, $2^8$) serially coupled unit resistors. Resistor string 270 includes 16 (that is, $2^4$) columns 271–286 of series coupled unit resistors. Each column includes 16 (that is, $2^4$) resistors such as resistors 281–296 in column 271. Thus in this illustrative embodiment, n=8, k=4, and m=4. Similar resistors are included in each of the other columns although the other resistor are not labeled with reference numerals.

Each of the 256 resistors can be configured with substantially the same resistance. The resistors can be fabricated, for example, from impurity doped polycrystalline silicon, although other resistor material can also be used. Depending on the application, each of the unit resistors can have, for example, a resistance of between about 50 Ohms and about 1000 Ohms. The illustrated placement of the columns matches the relative physical layout location of the columns as implemented in an integrated circuit embodiment. For example, column 272 is physically located between columns 271 and 273.

In accordance with an exemlary embodiment of the invention, resistor string 270 can be divided into 4 groups of columns (g=2), each group of columns having substantially the same total series resistance. The grouping of columns can be configured such that the columns are numbered sequentially from 1 to 16 (that is, from 1 to $2^k$) corresponding to their physical location in the layout. Column 1 corresponds to column 271, i.e., the column on the far left of the illustrated array, column 2 corresponds to the next column, column 272, and so on until column 16 corresponds to column 286, i.e., the column on the far right of the illustrated array. Each group of columns includes 4 columns, and the 4 columns in each group are selected so that the sum of the column numbers in each group of columns is identical. For example, the first group of columns includes columns 1, 8, 9, and 16 (or columns 271, 278, 279, and 286), the second group of columns includes columns 4, 5, 12, and 13 (or columns 274, 275, 282, and 283), the third group of columns includes columns 3, 6, 11, and 14 (or columns 273, 276, 281, and 284), and the fourth group of columns includes columns 2, 7, 10, and 15 (or columns 272, 277, 280, and 285). Accordingly, the sum of the column numbers in each group of columns is equal to 34.

Columns within each group of columns can be suitably intercoupled by conductive interconnections, such as the aluminum, copper, or other metallic wiring interconnection material used in fabricating the integrated resistor string. In the first group of columns, column 271 is coupled to column 278 by conductive connector 290, column 278 is coupled to column 279 by conductive connector 291, and column 279 is coupled to column 286 by conductive connector 292. In the second group of columns, column 283 is coupled to column 282 by conductive connector 293, column 282 is coupled to column 275 by conductive connector 294, and column 275 is coupled to column 274 by conductive connector 295. In the third group of columns, column 273 is coupled to column 276 by conductive connector 296, column 276 is coupled to column 281 by conductive connector 297, and column 281 is coupled to column 284 by conductive connector 298. In the fourth group of columns, column 285 is coupled to column 280 by conductive connector 299, column 280 is coupled to column 277 by conductive connector 300, and column 277 is coupled to column 272 by conductive connector 301.

The groups of columns can also be serially intercoupled by conductive interconnections such as aluminum, copper, or other metallic wiring interconnection material used in fabricating the integrated resistor string. Column 286 in the first group of columns is coupled to column 283 in the second group of columns by conductive connector 302, column 274 in the second group of columns is coupled to column 273 in the third group of columns by conductive connector 303, and column 284 in the third group of columns is coupled to column 285 in the fourth group of columns by conductive connector 304. The extremity of column 271 is also coupled to a reference voltage terminal 306 that is configured to be coupled to a first external voltage reference source (not illustrated) such as $V_{rH}$, and the extremity of column 272 is coupled to a second voltage reference terminal 308 that is configured to be coupled to a second external voltage reference source (not illustrated) such as $V_{rL}$. The 256 unit resistors are thus serially coupled between voltage reference terminals 306 and 308.

Resistor string 270 also includes voltage reference tap points at the node at each end of each of the unit resistors. For example, in column 271 voltage reference tap points 311–327 are provided at the ends of resistors 281–296, respectively. Similar voltage reference tap points are provided (although not labeled with reference numbers) in each of the other columns. Switches 331–347 are coupled to voltage reference tap points 311–327, respectively, to selectively couple a voltage reference tap point to the output (not illustrated) of the resistor string circuit. Again, similar switches are coupled to the voltage reference tap points in the other columns, but only the switches coupled to the voltage reference tap points in column 271 have been labeled with reference numbers. Clock lines 351–366 are coupled to the switches in each of the columns, respectively, to clock the switches at the appropriate time. Bus terminals 371–387 are respectively coupled to a switch in each of the columns. The coupling of a switch and of a selected voltage reference tap point to the resistor string output can be accomplished in a conventional manner by a switch matrix (not illustrated). With $V_{rH}$ and $V_{rL}$ applied to the ends of the resistor string, a current flows through the string and a voltage drop occurs across each of the resistors in the string. The voltage at any selected voltage reference tap point can be coupled to the output to be used, for example, in converting a digital input to an analog output in a DAC.

In accordance with this exemplary embodiment of the invention, in the case where g=2, the columns of resistor string 270 are divided into four groups of columns of series coupled resistors. The total resistance of each group of columns of resistors is substantially the same as the total resistance of each of the other groups of columns of resistors. For an application including a linearly increasing resistor gradient error from column 271 to column 286 of resistor string 270, because the four groups of columns of resistors each have substantially the same total resistance, the output for resistor string 270, as illustrated by curve 210 in FIG. 2, is a generally double S-shaped linearity error having five points at which the curve corresponds to the ideal resistor string output, curve 204. The five points correspond to the voltage reference tap points at the ends of the four groups of columns of resistors. The linearity error of resistor string 270 is significantly reduced in comparison to the linearity error of resistor string 99.

Figure 4:
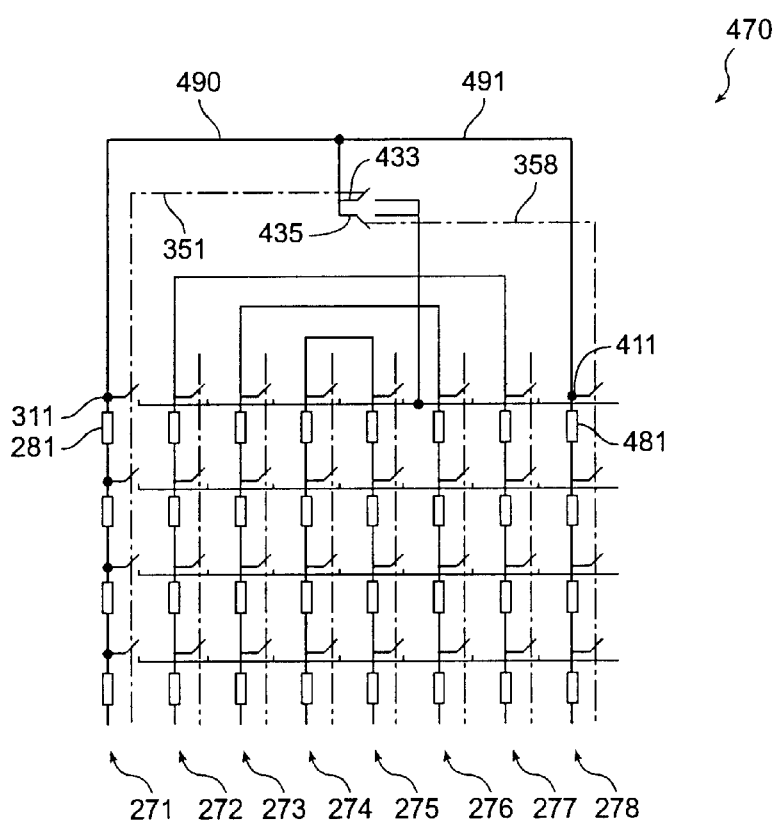
FIG. 4 illustrates schematically a resistor string in accordance with another exemplary embodiment of the present invention.

As noted from reference again to FIG. 3, the length of some of the conductive connectors coupling some of the columns can be extensive. For example, conductive connectors 297, 299, and 301 can span more than four columns and conductive connectors 290, 292, and 294 span more than six columns. Although every reasonable effort can be made to reduce the resistance of interconnecting lines during the fabrication of an integrated circuit, the conductive lines can still have a finite and non-negligible resistance, especially when the line are extensive in length. It should be noted, for example, that voltage reference tap point 311 at the node at the end of unit resistor 281 in column 271 is designed to be at the same voltage as is voltage reference tap point 411 at the node at the end of unit resistor 481 in column 278. Ideally the same reference voltage is coupled to bus 371 upon the closure of either switch 331 or switch 431. Because of the resistance of conductive connector 290, however, voltage reference tap point 411 may be at a noticeably lower reference voltage than is voltage reference tap point 311. This difference in reference voltages due to the Ohmic drop in conductive connector 290 can be ameliorated, to some extent, by a further exemplary embodiment of the invention as illustrated in FIG. 4. FIG. 4 illustrates a portion of a resistor string 470, similar to resistor string 270 illustrated in FIG. 3 except for the differences noted hereafter. Like numbers have been used to identify like elements. Only the portion of the resistor string 470 necessary to explain this exemplary embodiment of the present invention is illustrated.

Resistor string 470 differs from resistor string 270 in that switches 331 and 431 have been replaced by switches 433 and 435, respectively, and conductive connector 290 has been replaced by conductive connectors 490 and 491. Conductive connectors 490 and 491 are of substantially the same length and in combination have substantially the same length as did conductive connector 290. Switches 433 and 435, controlled by clock lines 351 and 358, respectively, have been placed at locations between the conductive connectors midway between columns 271 and 278 so that the resistance of conductive connector 490 is lumped together with the resistance of unit resistor 281 and the resistance of conductive connector 491 is lumped together with the resistance of unit resistor 481. The resistance of the conductive connector that couples columns 271 and 278 is thus shared between resistors 281 and 481.

Although illustrated as it applies to conductive conductor between columns 271 and 278, this exemplary embodiment of the invention can be applied to any of the other conductive connectors used to couple columns of resistors or groups of columns of resistors. For example, this embodiment of the invention can be also applied to conductive connectors 294, 297, 299, 300, or 301 of resistor string 270. In general, this exemplary embodiment of the invention can be advantageously applied to any conductive connector that couples any columns or any groups of columns if the resistance of the conductive connector exceeds a predetermined percentage of the resistance of one of the $2^n$ unit resistors.

Figure 5:
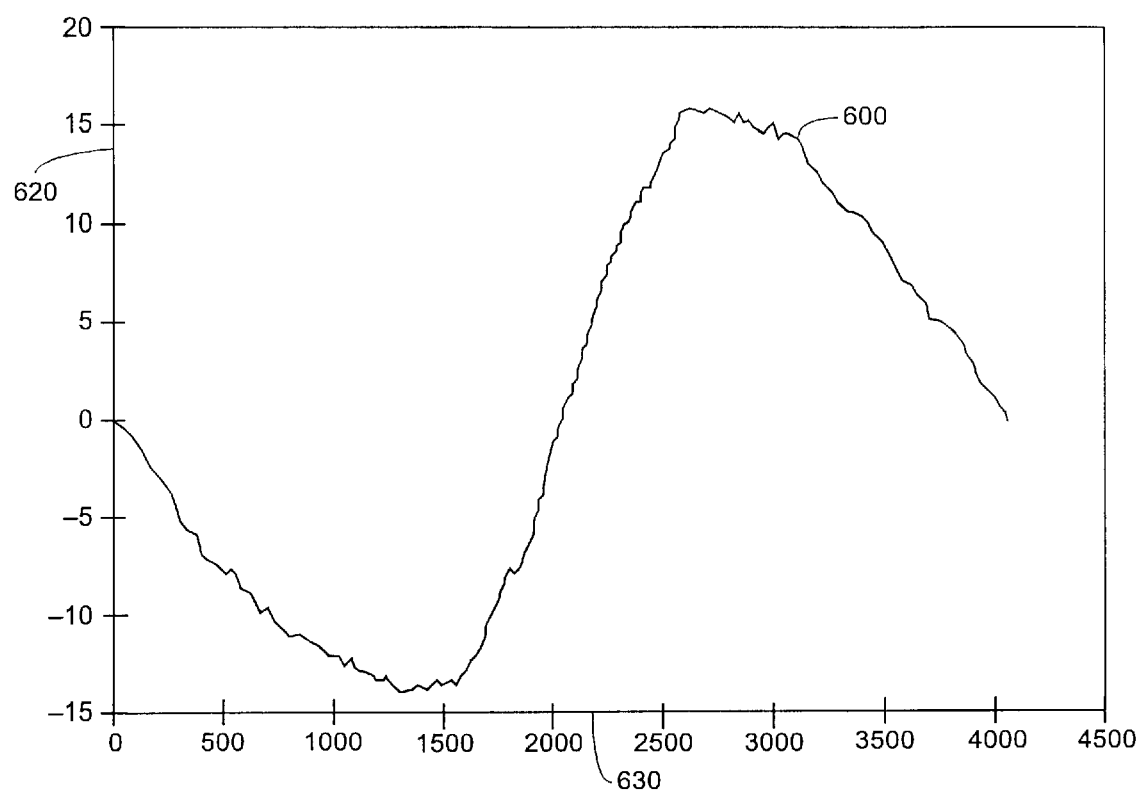
FIGS. 5 and 6 illustrate results achieved by practice of the invention in comparison to results achieved by practice of the prior art.
Figure 6:
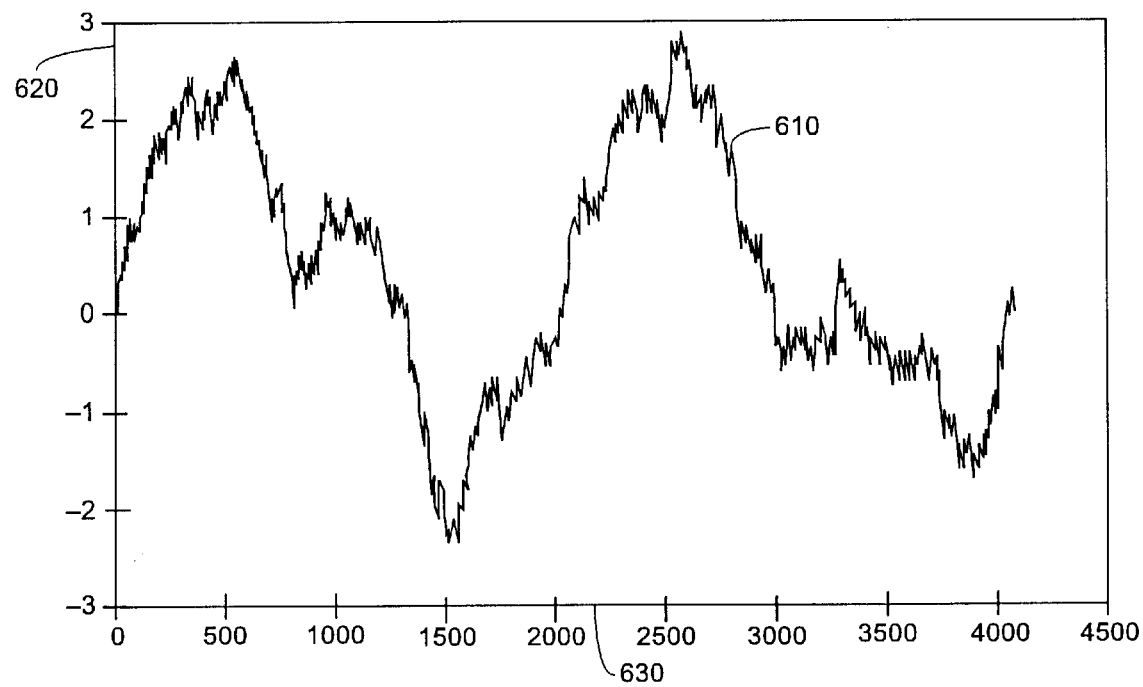

FIGS. 5 and 6 illustrate graphically comparative results that can be achieved through practice of the prior art (FIG. 5), and through practice of various exemplary embodiments of the present invention (FIG. 6), in which FIGS. 5 and 6 illustrate results achieved on actual integrated devices. In this example, each of FIGS. 5 and 6 illustrates the measured linearity error for an 8-bit DAC and a 4-bit interpolator. FIG. 5 illustrates the results, depicted at 600, measured on a DAC including a resistor string similar to prior art resistor string 99 illustrated in FIG. 1. Meanwhile, FIG. 6 illustrates the results, depicted at 610, measured on a DAC including a resistor string similar to resistor string 270 illustrated in FIG. 3. In each figure, vertical axis 620 depicts the linearity error in units of least significant bits (LSB) and horizontal axis 630 depicts the input DAC code. It is apparent from a comparison of FIGS. 5 and 6 that a significant improvement in linearity error can be achieved through practice of the invention.

Thus it is apparent that there has been provided, in accordance with the invention, a resistor string integrated circuit and a method for reducing linearity errors in an integrated resistor string. The invention has been described and illustrated by reference to an exemplary embodiment comprising an 8-bit resistor string having 256 serially coupled unit resistors. However, the invention is also applicable to other n-bit resistor strings where n can be, for example, 9 or 10. For a 10-bit resistor string (not illustrated), for example, the $2^{10}$ or 1024 unit resistors can be arrayed, for example, in 32 columns of 32 resistors each or in 64 columns of 16 resistors each. If arrayed in 32 columns, the columns could be grouped, for example, in groups of four or eight series coupled columns. If arrayed in 64 columns, the columns could be grouped, for example, in groups of four, eight, or sixteen series coupled columns. Those of skill in the art will appreciate that other modifications, variations, an applications are possible without departing from the broad scope and spirit of the invention. Accordingly, it is intended to include within the invention all such variations, modifications, and applications as fall within the scope of the appended claims.

What is claimed is:

1. An integrated circuit comprising a resistor string, the resistor string comprising:

$2^n$ resistors, the resistors arrayed in $2^k$ columns, the columns sequentially numbered from 1 to $2^k$ corresponding to the physical location of the columns, each column comprising $2^m$ series coupled resistors where n, k, and m are integers and n=k+m;

a grouping of columns into $2^g$ groups of columns, where g is an integer having a value greater than 1 and wherein the sum of the column numbers in each group of columns is the same as the sum of the column numbers in each of the other groups of columns;

conductive connectors serially coupling the columns within each group of columns; and conductive connectors serially coupling each group of columns, and wherein said resistor string is configured for reducing linearity error in said integrated circuit.

2. The integrated circuit of claim 1, wherein the $2^n$ resistors each have substantially the same resistance.

3. The integrated circuit of claim 1, wherein the $2^n$ resistors comprise polycrystalline silicon resistors.

4. The integrated circuit of claim 1, wherein said resistor string further comprises a voltage reference tap point located proximate an extremity of each of the $2^n$ resistors.

5. The integrated circuit of claim 4, wherein said resistor string further comprises a switch coupled to each of the voltage reference tap points.

6. The integrated circuit of claim 5, wherein said resistor string further comprises a switching matrix circuit coupled to the switches.

7. The integrated circuit of claim 1, wherein said resistor string further comprises:

a voltage reference tap point coupled to each end of each of the $2^n$ resistors; and a switch coupled to each of the voltage reference tap points, the switches coupled to resistors at the ends of at least two of the columns located substantially at the midpoint of the conductive connector serially coupling the two columns.

8. The integrated circuit of claim 1, wherein said resistor string further comprises:

a voltage reference tap point coupled to each end of each of the $2^n$ resistors, and a switch coupled to each of the voltage reference tap points, the switches coupled to resistors at the ends of two columns located to divide the resistance of the conductive connector coupling the two columns when the resistance of the conductive connector coupling the two columns exceeds a predetermined percentage of the resistance of one of the $2^n$ resistors.

9. An integrated digital to analog converter circuit comprising:

first and second voltage reference terminals configured to receive first and second reference voltages;

$2^n$ unit resistors serially coupled between the first and second voltage reference terminals, the resistors arrayed in $2^k$ columns, the columns sequentially numbered from 1 to $2^k$ corresponding to the physical location of the columns, each column comprising $2^m$ series coupled resistors where n, k, and m are integers and n=k+m;

a grouping of columns into $2^g$ groups of columns, where g is an integer having a value greater than 1 and wherein the sum of the column numbers in each group of columns is the same as the sum of the column numbers in each of the other groups of columns;

$2^m+1$ voltage reference tap points in each column, the voltage reference tap points coupled to the ends of each of the unit resistors;

a switching matrix circuit coupled to the voltage reference tap points and configured to couple one of the voltage reference tap points to an output; and wherein said resistor string is configured for reducing linearity error in said integrated circuit.

10. The integrated digital to analog circuit of claim 9, wherein the switching matrix circuit comprises:

a switch coupled to each of the voltage reference tap points; and a bus coupled to a switch in each of the columns.

* * * * *